(12) United States Patent
Yeo et al.

(10) Patent No.: US 9,671,637 B2
(45) Date of Patent: Jun. 6, 2017

(54) TOUCH SCREEN SUBSTRATE AND METHOD OF MANUFACTURING THE SAME

(75) Inventors: Yun-Jong Yeo, Seoul (KR); Hong-Kee Chin, Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 1559 days.

(21) Appl. No.: 12/903,688

(22) Filed: Oct. 13, 2010

(65) Prior Publication Data
US 2011/0234536 A1  Sep. 29, 2011

(30) Foreign Application Priority Data
Feb. 2, 2010  (KR) .................. 10-2010-0009413

(51) Int. Cl.
*G06F 3/042* (2006.01)
*G02F 1/1333* (2006.01)
(Continued)

(52) U.S. Cl.
CPC .......... *G02F 1/13338* (2013.01); *G06F 3/042* (2013.01); *G06F 3/0412* (2013.01);
(Continued)

(58) Field of Classification Search
CPC ................................. G06F 3/041–3/047; G06F 2203/041–2203/04113; G02F 1/13338;
(Continued)

(56) References Cited

U.S. PATENT DOCUMENTS 5,640,260 A * 6/1997 Sumida .......................... 349/26
6,414,297 B1 * 7/2002 Sasaki .................. G06F 3/0421
250/214 R
(Continued)

FOREIGN PATENT DOCUMENTS

CN  101022085  8/2007
CN  101285975  10/2008
(Continued)

OTHER PUBLICATIONS

Chinese Office Action dated Dec. 29, 2014 in corresponding Chinese Appln. No. 20111008679.5.
(Continued)

*Primary Examiner* — Matthew Sim
(74) *Attorney, Agent, or Firm* — F. Chau & Associates, LLC

(57) ABSTRACT

In a touch screen substrate and a method of manufacturing the same, the touch screen substrate includes a base substrate, a light blocking pattern, a first sensing element and a first switching element. The light blocking pattern includes an inorganic layer formed on the base substrate and a light blocking layer formed on the inorganic layer, the light blocking layer transmitting an infrared light and absorbing a visible light. The first sensing element is formed on the light blocking pattern and senses the infrared light. The first switching element is electrically connected to the first sensing element. Thus, an undercut may be prevented from being formed at a lower portion of the light blocking pattern, and an adhesive strength between the light blocking pattern and the base substrate may be enhanced.

17 Claims, 14 Drawing Sheets

(51) Int. Cl.
*G06F 3/041* (2006.01)
*H01L 27/12* (2006.01)

(52) U.S. Cl.
CPC .......... *H01L 27/12* (2013.01); *H01L 27/1214* (2013.01); *Y10T 29/49105* (2015.01)

(58) Field of Classification Search
CPC  Y10T 29/49105; H01L 27/1214; H01L 27/12
See application file for complete search history.

(56) References Cited

U.S. PATENT DOCUMENTS

| | | | |
|---|---|---|---|
| 8,446,390 | B2 | 5/2013 | Hattori |
| 2005/0243023 | A1 | 11/2005 | Reddy et al. |
| 2008/0245948 | A1 | 10/2008 | Tsai |
| 2008/0246739 | A1* | 10/2008 | Choi et al. ............... 345/173 |
| 2009/0050906 | A1 | 2/2009 | Cho et al. |
| 2009/0289910 | A1* | 11/2009 | Hattori ............... 345/173 |
| 2009/0315859 | A1* | 12/2009 | Chien et al. ............... 345/175 |

FOREIGN PATENT DOCUMENTS

| | | |
|---|---|---|
| CN | 101408813 | 4/2009 |
| JP | 2007052102 | 3/2007 |
| JP | 2009-135188 | 6/2009 |
| JP | 2009229502 | 10/2009 |
| JP | 2009231643 | 10/2009 |
| KR | 1020040081885 | 9/2004 |
| KR | 1020060132372 | 12/2006 |
| KR | 1020070002280 | 1/2007 |
| KR | 1020080058960 | 6/2008 |
| KR | 1020080090886 | 10/2008 |
| KR | 1020080112847 | 12/2008 |
| KR | 1020090122127 | 11/2009 |
| WO | 2009/116205 | 9/2009 |

OTHER PUBLICATIONS

Office Action dated Jan. 21, 2016 from the Korean Patent Office in connection with corresponding Korean Patent Application No. 10-2010-009413.

* cited by examiner

TOUCH SCREEN SUBSTRATE AND METHOD OF MANUFACTURING THE SAME

CROSS-REFERENCE TO RELATED APPLICATION

This application claims priority under 35 U.S.C. §119 to Korean Patent Application No. 2010-9413, filed on Feb. 2, 2010 in the Korean Intellectual Property Office (KIPO), the contents of which are herein incorporated by reference in their entirety.

BACKGROUND

1. Technical Field

Exemplary embodiments of the present invention relate to a touch screen substrate and a method of manufacturing the touch screen substrate. More particularly, exemplary embodiments of the present invention relate to a touch screen substrate that improves the reliability of a manufacturing process and a method of manufacturing the touch screen substrate.

2. Discussion of the Related Art

Generally, a liquid crystal display (LCD) panel includes a first substrate having switching elements for driving pixels, a second substrate facing the array substrate, and a liquid crystal layer interposed between the first and second substrates. Liquid crystal molecules in the liquid crystal layer control light transmittance according to an electric field applied to the liquid crystal layer so that the LCD panel displays an image.

The LCD panel functions as a touch panel operating in response to an external pressure. The second substrate of the touch panel includes a photo sensor and a switching element controlling the photo sensor. When the external pressure is exerted upon the LCD panel, light generated from a backlight disposed under the LCD panel is reflected by a foreign object touching the panel and then is provided to the photo sensor, and thus the photo sensor absorbs the reflected light to generate a photo current. A central processing unit connected to the LCD panel calculates a touch position based on a difference between the photo current and a dark current generated by the photo sensor before the light is incident to the photo sensor.

When the external pressure is exerted upon the LCD panel, the reflected light and external light different from the reflected light may be together provided to the photo sensor. The photo sensor senses the external light as well as the reflected light so that the central processing unit does not exactly calculate the touch position. In order to address this issue, a light blocking pattern is formed under the photo sensor, and the light blocking pattern transmits necessary light having a specific wavelength and prevents the external light from being provided to the photo sensor.

However, when the light blocking pattern is not uniformly formed on the second substrate, a plurality of upper patterns formed on the light blocking pattern may not be uniformly formed on the second substrate because the light blocking pattern is a pattern firstly formed on the second substrate. Thus, the reliability of a manufacturing process of the upper patterns may be reduced.

SUMMARY

Exemplary embodiments of the present invention provide a touch screen substrate capable of improving the reliability of a manufacturing process of a light blocking pattern and enhancing an adhesive strength between the light blocking pattern and a substrate, and a method of manufacturing the touch screen substrate.

According to an exemplary embodiment of the present invention, a touch screen substrate includes a base substrate, a light blocking pattern, a first sensing element and a first switching element. The light blocking pattern includes an inorganic layer formed on the base substrate and a light blocking layer formed on the inorganic layer, the light blocking layer transmitting infrared light and absorbing visible light. The first sensing element is formed on the light blocking pattern and senses the infrared light. The first switching element is electrically connected to the first sensing element.

According to an embodiment, the inorganic layer may include silicon nitride or silicon oxide.

According to an embodiment, the touch screen substrate may further include a residual layer formed on an entire region of the base substrate except for a region on which the inorganic layer is formed, and the residual layer may have a thickness smaller than that of the inorganic layer. The first switching element may be formed on the residual layer.

According to an embodiment, the light blocking layer may include amorphous silicon germanium (a-SiGe) or amorphous germanium (a-Ge).

According to an embodiment, the touch screen substrate may further include a bias line, a first read-out line, a first sensing gate line and a second sensing gate line. The bias line may be connected to the first sensing element. The first read-out line may be connected to the first switching element to output a first gate signal of the first sensing element to the first switching element. The second sensing gate line may be connected to the first sensing element and applies to a second gate signal to the first sensing element.

According to an embodiment, the touch screen substrate may further include a second sensing element connected to the bias line and sensing the visible light, a second switching element connected to the second sensing element, a third gate line connected to the second switching element to apply a third gate signal to the second switching element, and a second read-out line connected to the second switching element to output a visible light sensing signal of the second sensing element.

According to an exemplary embodiment of the present invention, there is provided a method of manufacturing the touch screen substrate. In the method, a light blocking pattern is formed on a base substrate. The light blocking pattern includes an inorganic layer and a light blocking layer formed on the inorganic layer, and the light blocking layer transmits infrared light and absorbs visible light. A first sensing element is formed on the light blocking pattern. A first switching element is formed on the base substrate, and the switching element is electrically connected to the first sensing element.

According to an embodiment, a sacrificial layer may be formed on the base substrate, and a parent light blocking layer may be formed on the base substrate including the sacrificial layer formed on the base substrate. The parent light blocking layer may be patterned using an etching gas to form the light blocking layer, and the sacrificial layer may be patterned to form the inorganic layer.

According to an embodiment, the sacrificial layer except for the inorganic layer may be removed to expose the base substrate while forming the inorganic layer.

According to an embodiment, the sacrificial layer may be partially removed to form a residual layer having a thickness smaller than an initial thickness of the sacrificial layer and the first switching element may be formed on the residual layer.

According to an embodiment of the present invention, an undercut may be prevented from being formed at a lower portion of the light blocking pattern while forming the light blocking pattern blocking the visible light provided to the sensing element sensing the infrared light. In addition, an adhesive strength between the light blocking pattern and the base substrate may be enhanced. Therefore, the reliability of a manufacturing process may be improved.

BRIEF DESCRIPTION OF THE DRAWINGS

The embodiments of the present invention will become more apparent by describing in detail exemplary embodiments thereof with reference to the accompanying drawings, in which.

DETAILED DESCRIPTION OF THE INVENTION

Exemplary embodiments of the present invention are described more fully hereinafter with reference to the accompanying drawings. Like numerals may refer to like elements throughout the drawings and the specification.

Figure 1:
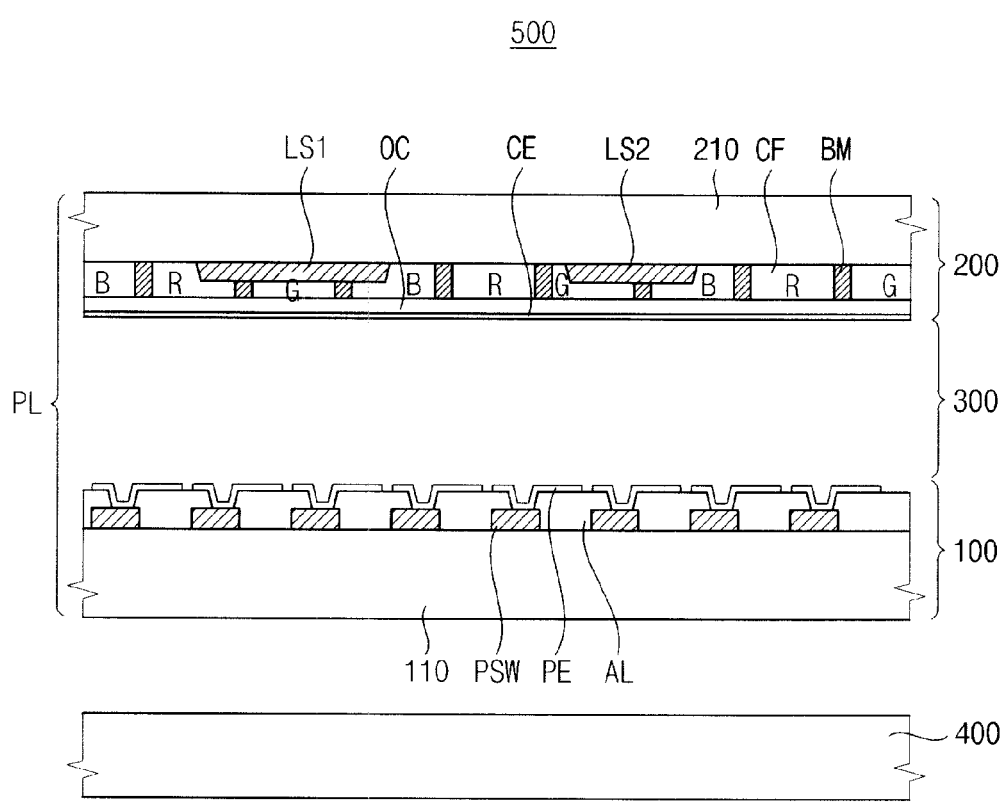
FIG. 1 is a cross-sectional view illustrating a display panel according to an exemplary embodiment of the present invention.

FIG. 1 is a cross-sectional view illustrating a display panel according to an exemplary embodiment of the present invention.

Referring to FIG. 1, a display device 500 according to the present exemplary embodiment includes a display panel PL and a backlight assembly 400 providing light to the display panel PL. The display panel PL includes a first array substrate 100, a first touch screen substrate 200 and a liquid crystal layer 300. The display device 500 may sense a position of an object touching the display panel PL. In addition, the display device 500 may scan an image disposed on the display panel PL. The backlight assembly 400 is disposed under the first array substrate 100.

The first array substrate 100 includes a pixel switching element PSW, a pixel electrode PE electrically connected to the pixel switching element PSW, and an array layer AL which are formed on a first substrate 110. The pixel electrode PE may define a pixel unit of the first array substrate 100.

The first touch screen substrate 200 faces the first array substrate 100 and combines with the array substrate 100 so that the liquid crystal layer 300 is interposed between the first array substrate 100 and the first touch screen substrate 200. The first touch screen substrate 200 includes a first photo sensor LS1 and a second photo sensor LS2 which are formed on a second base substrate 210. The first touch screen substrate 200 may further include a black matrix BM, a color filter CF, an over-coating layer OC and a common electrode CE. The common electrode CE faces the pixel electrode PE to generate an electric field. Each of the first photo sensor LS1 and the second photo sensor LS2 may be disposed in a region corresponding to three pixel units of the first array substrate 100. The first photo sensor LS1 senses infrared light and the second photo sensor LS2 senses visible light.

The backlight assembly 400 is disposed under the first array substrate 100. The backlight assembly 400 may include an infrared light source which provides the infrared light to the display panel PL, and a visible light source which provides the visible light to the display panel PL. Each of the infrared light source and the visible light source may include a light emitting diode (LED).

Figure 2:
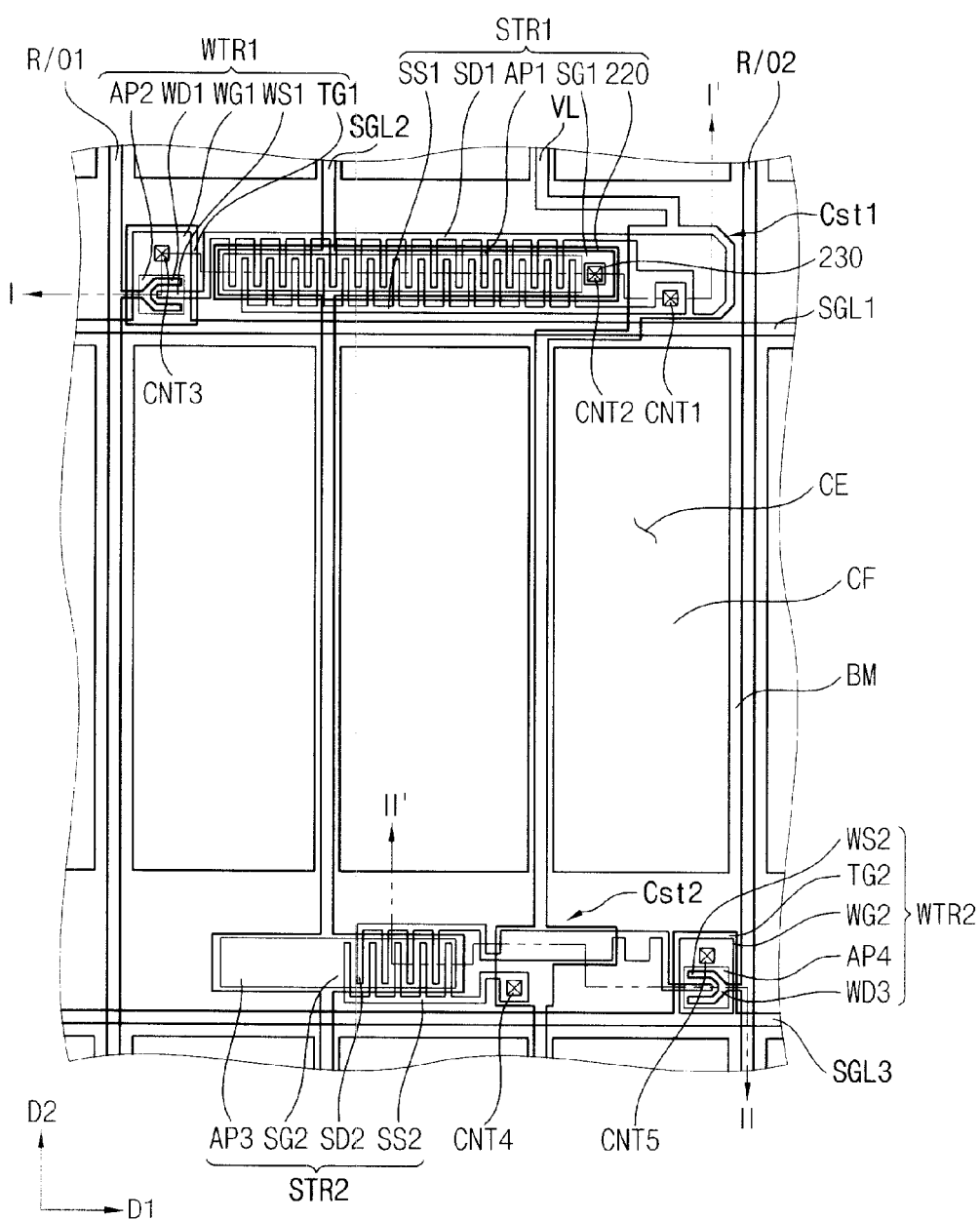
FIG. 2 is a plan view illustrating a touch screen substrate in FIG. 1.

FIG. 2 is a plan view illustrating a touch screen substrate in FIG. 1.

Referring to FIG. 2, the first touch screen substrate 200 includes the first photo sensor LS1 including a first switching element WTR1 and a first sensing element STR1, a first sensing gate line SGL1, a second sensing gate line SGL2, a bias line VL, a first read-out line R/O1, a light blocking pattern BP, a first capacitor Cst1, a black matrix BM, a color filter CF, and a common electrode CE.

The first sensing gate line SGL1 extends in a first direction D1 and applies a first sensing gate signal. The second sensing gate line SGL2 extends in a second direction D2 different from the first direction D1 to cross the first sensing gate line SGL1 and applies a second sensing gate signal. The first direction D1 may be substantially perpendicular to the second direction D2.

The bias line VL extends in the second direction D2 and applies a source bias. The bias line VL is disposed in the first direction D1 of the second sensing gate line SGL2.

The first read-out line R/O1 extends in the second direction D2. The first read-out line R/O1 is adjacent to the second sensing gate line SGL2 so that the second sensing gate line SGL2 is disposed between the first read-out line R/O1 and the bias line VL. An infrared sensing signal generated by the first sensing element STR1 is outputted to a central processing unit connected to the display panel PL.

Figure 3A:
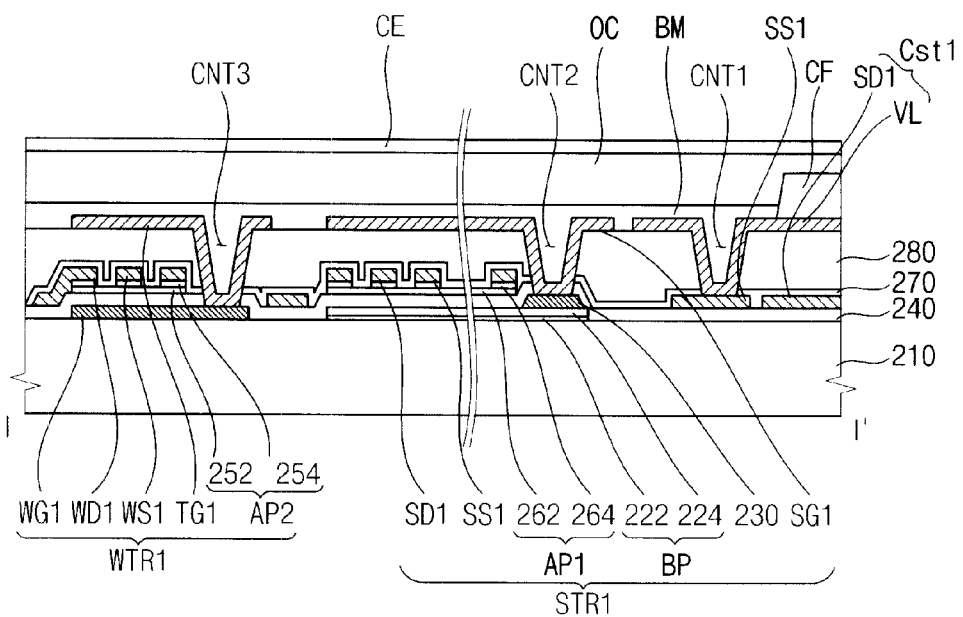
FIG. 3A is a cross-sectional view taken along a line I-I' in FIG. 2.

FIG. 3A is a cross-sectional view taken along a line I-I' in FIG. 2.

Referring to FIGS. 2 and 3A, the light blocking pattern BP is formed under the first sensing element STR1. The light blocking pattern BP includes an inorganic layer 222 on the second base substrate 210 and a light blocking layer 224 on the inorganic layer 222. The inorganic layer 222 may minimize damage to the light blocking layer 224 so that an undercut may be prevented from being formed at a lower portion of the light blocking layer 224 while forming the light blocking layer 224. In addition, the inorganic layer 222 may enhance an adhesive strength between the second base substrate 210 and the light blocking layer 224. The light blocking pattern BP will be described in greater detail referring to FIG. 3B.

The first sensing element STR1 senses infrared light provided from the backlight assembly 400. The first sensing element STR1 is electrically connected to the second sensing gate line SGL2, the bias line VL and the first switching element WTR1. The first sensing element STR1 includes a first sensing gate electrode SG1, a first sensing source electrode SS1, a first sensing drain electrode SD1, and a first active pattern AP1. The first sensing gate electrode SG1 is connected to the second sensing gate line SGL2. The first sensing source electrode SS1 is connected to the bias line VL through a first contact hole CNT1. The first sensing drain electrode SD1 is spaced apart from the first sensing source electrode SS1 and is electrically connected to the first switching element WTR1. Each of the first sensing source and drain electrodes SS1 and SD1 may have an embossing structure having a repeated U-shape to increase a channel region. The first active pattern AP1 overlaps the first sensing gate electrode SG1 and partially overlaps each of the first sensing source and drain electrodes SS1 and SD1. The first active pattern AP1 includes a first semiconductor layer 262 and a first ohmic contact layer 264. The first semiconductor layer 262 may include amorphous silicon germanium (a-SiGe). The first ohmic contact layer 264 may include amorphous silicon doped with a high-concentration of n-type impurities (n+a-Si).

The first sensing element STR1 may be electrically connected to the light blocking pattern BP through a second contact hole CNT2. The second sensing gate signal applied via the second sensing gate line SGL2 may be applied to the first sensing gate electrode SG1 and the light blocking pattern BP. Alternatively, the light blocking pattern BP may be connected to an additional signal line to apply an additional sensing gate signal. The first sensing gate electrode SG1 may be connected to the light blocking pattern BP via a contact electrode 230 at the second contact hole CNT2. The contact electrode 230 is formed on the light blocking pattern BP in a region corresponding to the second contact hole CNT2 so that the light blocking pattern BP exposed through the second contact hole CNT2 may be protected by the contact electrode 230. Thus, the first sensing element STR1 may have a double gate structure including the light blocking pattern BP and the first sensing gate electrode SG1. Electrical charges generated by irradiating the light blocking pattern BP with the infrared light may be discharged by connecting the light blocking pattern BP with the second sensing gate line SGL2. In addition, a bias of the light blocking pattern BP may be constantly maintained by connecting the light blocking pattern BP with the second sensing gate line SGL2.

Figure 3B:
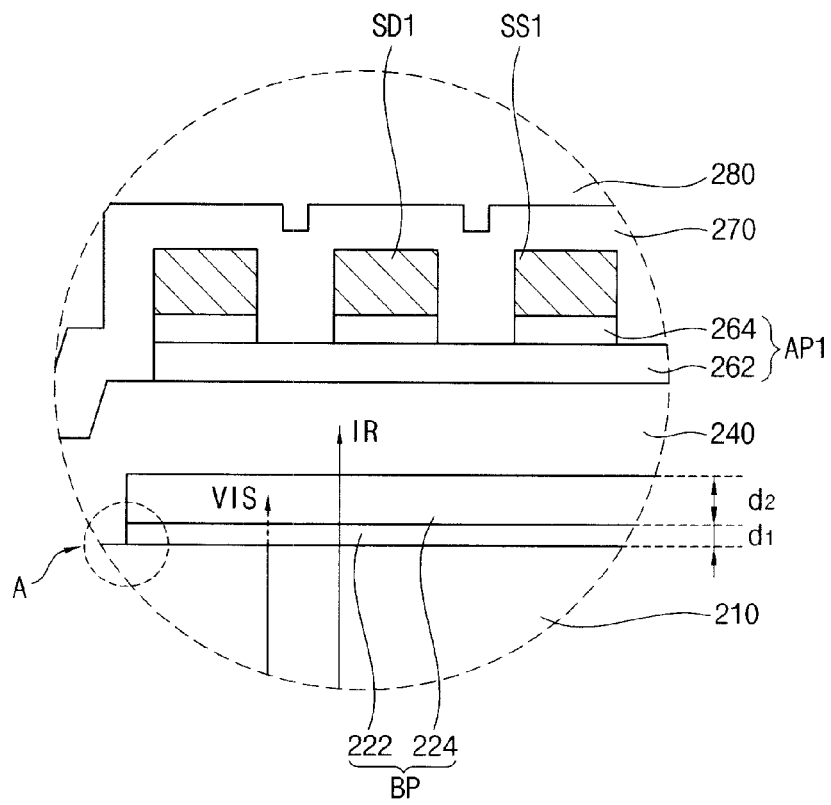
FIG. 3B is an enlarged cross-sectional view illustrating part of a first sensing element in FIG. 3A.

FIG. 3B is an enlarged cross-sectional view illustrating part of a first sensing element in FIG. 3A.

Referring to FIG. 3B, infrared light provided from the backlight assembly 400 passes through the light blocking pattern BP, and infrared light IR reflected by an object contacting the second base substrate 210 may pass through the light blocking pattern BP back to the first active pattern AP1. External visible light VIS provided from an outside of the second base substrate 210 may not pass through the second base substrate 210 due to the light blocking pattern BP. The light blocking pattern BP absorbs the external visible light VIS to block the external visible light VIS. Substantially, the light blocking layer 224 of the light blocking pattern BP transmits the reflected infrared light IR and blocks the external visible light VIS.

The inorganic layer 222 has a first thickness $d_1$. The light blocking layer 224 has a second thickness $d_2$ and is formed on the inorganic layer 222. The first thickness $d_1$ is smaller than the second thickness $d_2$. For example, the first thickness $d_1$ may be in a range of about 100 Å to about 1,000 Å. The second thickness $d_2$ may be in a range of about 1,500 Å to about 5,000 Å.

The inorganic layer 222 may include a transparent inorganic material. For example, the inorganic layer 222 may include silicon nitride ($SiN_x$, $0<x\leq 1$) or silicon oxide ($SiO_y$, $0<y\leq 1$), etc.

The light blocking layer 224 includes a semiconductor material. For example, the light blocking layer 224 may include amorphous silicon germanium (a-SiGe). The light blocking pattern BP transmits the infrared light and absorbs the visible light to block the visible light. The number of germanium atoms in the light blocking layer 224 may be greater than that of germanium atoms in the first semiconductor layer 262.

Although not shown in the figures, the light blocking layer 224 may include a first layer including amorphous germanium and a second layer including amorphous silicon germanium and formed on the first layer.

Etched surfaces "A" of the inorganic layer 222 and the light blocking layer 224 may substantially coincide with each other. The inorganic layer 222 is formed under the light blocking layer 224 so that an undercut may be prevented from being formed at a lower portion of the light blocking layer 224 while forming the light blocking layer 224. Thus, a lower side portion of the light blocking pattern BP may directly contact the second base substrate 210.

An adhesive strength between the second base substrate 210 and the light blocking layer 224 may be enhanced by the inorganic layer 222. An adhesive strength between the second base substrate 210 and the inorganic layer 222 is greater than the adhesive strength between the second base substrate 210 and the light blocking layer 224. For example, a surface energy difference between the inorganic layer 222 and the second base substrate 210 is less than that between the light blocking layer 224 and the second base substrate 210, so that the adhesive strength between light blocking layer 224 and the second base substrate 210 may be enhanced by the inorganic layer 222.

Referring to FIGS. 2 and 3A again, the first switching element WTR1 is connected to the first sensing gate line SGL1 and the first read-out line R/O1. The first switching element WTR1 includes a first switching gate electrode WG1, a first switching source electrode WS1, a first switching drain electrode WD1, and a second active pattern AP2. The first switching gate electrode WG1 is connected to the first sensing gate line SGL1. The first switching drain electrode WD1 is connected to the first read-out line R/O1. The first switching source electrode WS1 is spaced apart from the first switching drain electrode WD1 and is connected to the first sensing drain electrode SD1. The second active pattern AP2 overlaps the first switching gate electrode WG1 and partially overlaps the first switching source and drain electrode WS1 and WD1.

The first switching element WTR1 may further include a first top gate electrode TG1. The first top gate electrode TG1 faces the first switching gate electrode WG1. The first switching source and drain electrodes WS1 and WD1 and the second active pattern AP2 are disposed between the first top gate electrode TG1 and the first switching gate electrode WG1. The first top gate electrode TG1 may be electrically connected to the first switching gate electrode WG1 through a second contact hole CNT2. Thus, the first switching element WTR1 may have a double gate structure including the first top gate electrode TG1 and the first switching gate electrode WG1. The second active pattern AP2 includes a second semiconductor layer 252 and a second ohmic contact layer 254. The second semiconductor layer 252 may include amorphous silicon. The second ohmic contact layer 254 may include amorphous silicon doped with a high-concentration of n-type impurities (n+a-Si).

The first touch screen substrate 200 may further include a first insulating layer 240, a second insulating layer 270, and a third insulating layer 280. The first insulating layer 240 is formed on a first metal pattern including the first switching gate electrode WG1. The second insulating layer 170 is formed on a second metal pattern including the first switching source and drain electrodes WS1 and WD1 and the first sensing source and drain electrodes SS1 and SD1. The third insulating layer 280 is formed on the second insulating layer 270. A third metal pattern including the first top gate electrode TG1 and the first sensing gate electrode SG1 is formed on the third insulating layer 280.

The first capacitor Cst1 is defined by the first sensing drain electrode SD1 as a first electrode, the bias line BL as a second electrode facing the first electrode, and a dielectric layer including the second and third insulating layers 270 and 280 between the first and second electrodes.

The black matrix BM is formed on the second base substrate 210 over the first switching element WTR1, the first sensing element STR1, the first read-out line R/O1, the first and second sensing gate lines SGL1 and SGL2, and the bias line VL.

The color filter CF is formed adjacent to the black matrix BM. The color filter CF may be formed to face the pixel electrode PE of the first array substrate 100.

The first touch screen substrate 200 may further include an over-coating layer OC. The over-coating layer OC is formed on the second base substrate 210 having the black matrix BM and the color filter CF.

The common electrode CE is formed on the over-coating layer OC. The common electrode CE is entirely formed over a surface of the first touch screen substrate 200.

Infrared light is sensed using the first switching element WTR1 and the first sensing element STR1 as will be described below.

The first capacitor Cst1 is charged by a voltage applied to the first sensing drain electrode SD1 from the first read-out line R/O1. When the infrared light is provided to the first active pattern AP1 of the first sensing element STR1, the first active pattern AP1 is activated so that a voltage charged in the first capacitor Cst1 decreases in proportion to the radiation intensity of the infrared light. The voltage decreased by the infrared light is outputted through the first read-out line R/O1. The outputted signal is provided to the central processing unit, and then the central processing unit senses a touch position on the first touch screen substrate 200 based on the outputted signal.

Figure 4:
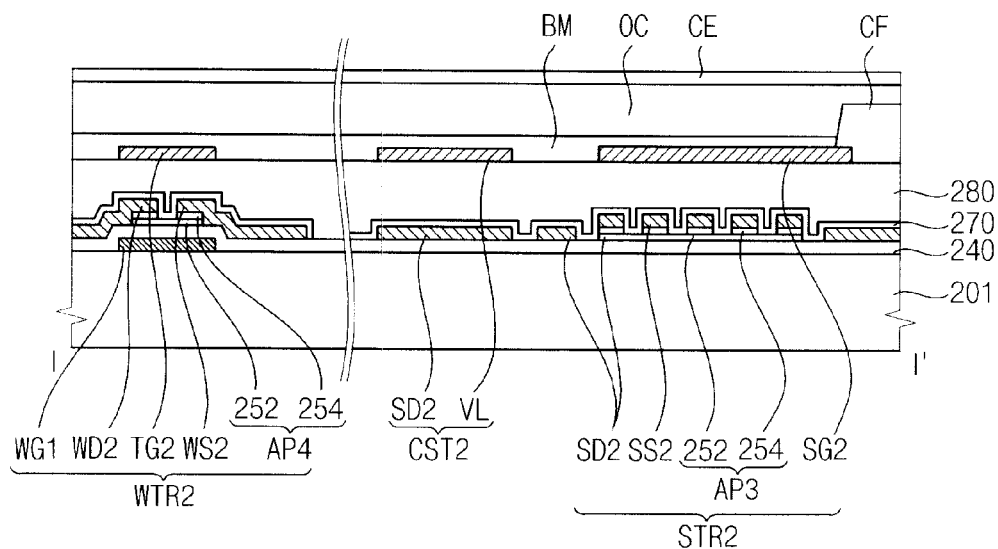
FIG. 4 is a cross-sectional view taken along a line II-II' line in FIG. 2.

FIG. 4 is a cross-sectional view taken along a line II-II' line in FIG. 2.

Referring to FIGS. 2 and 4, the first touch screen substrate 200 may further include a third sensing gate line SGL3, a second read-out line R/O2, a second switching element WTR2, a second sensing element STR2, and a second capacitor Cst2.

The third sensing gate line SGL3 extends in the first direction D1. The third sensing gate line SGL3 is disposed substantially parallel with the first sensing gate line SGL1. The second read-out line R/O2 extends in the second direction D2. The second read-out line R/O2 is disposed adjacent to the bias line VL. The second sensing gate line SGL2 and the bias line VL may be disposed between the first and second read-out lines R/O1 and R/O2.

The second sensing element STR2 senses visible light provided from the backlight assembly 400. The second sensing element STR2 is electrically connected to the second sensing gate line SGL2, the bias line VL, and the second switching element WTR2. The second sensing element STR2 includes the second sensing gate electrode SG2, the second sensing source electrode SS2, the second sensing drain electrode SD2, and a third active pattern AP3. The second sensing gate electrode SG2 is connected to the second sensing gate line SGL2. The second sensing source electrode SS2 is connected to the bias line VL through a fourth contact hole CNT4. The second sensing drain electrode SD2 is spaced apart from the second sensing source electrode SS2. Each of the second sensing drain and source electrodes SD2 and SS2 may have an embossing structure having a repeated U-shape to increase a channel region of the second sensing element STR2. The third active pattern AP3 overlaps the second sensing gate electrode SG2 and partially overlaps the second sensing source and drain electrodes SS2 and SD2

The second switching element WTR2 includes a second switching gate electrode WG2, a second switching source electrode WS2, a second switching drain electrode WD2, and a fourth active pattern AP4. The second switching gate electrode WG2 is connected to the third sensing gate line SGL3. The second switching drain electrode WD2 is connected to the second read-out line R102. The second switching source electrode WS2 is spaced apart from the second switching drain electrode WD2, and is electrically connected to the second sensing drain electrode SD2. The fourth active pattern AP4 overlaps the second switching gate electrode WG2.

The second switching element WTR2 may further include a second top gate electrode TG2. The second top gate electrode TG2 faces the second switching gate electrode WG2. The second switching source and drain electrodes WS2 and WD2 and the second active pattern AP2 are disposed between the second top gate electrode TG2 and the second switching gate electrode WG2. The second top gate electrode TG2 may be electrically connected to the second switching gate electrode WG2 through a fifth contact hole CNT5. Thus, the second switching element WTR2 may have a double gate structure including the second top gate electrode TG2 and the second switching gate electrode WG2.

The second capacitor Cst2 is defined by the second sensing drain electrode SD2 as a first electrode, the bias line VL as a second electrode facing the first electrode, and a dielectric layer disposed between the first and second electrodes and including the second and third insulating layers 270 and 280.

Hereinafter, a method of manufacturing the first touch screen substrate 200 shown in FIG. 3A will be described referring to FIGS. 5A, 5B and FIGS. 6 to 11.

FIGS. 5A and 5B and FIGS. 6 to 11 are cross-sectional views illustrating a method of manufacturing the touch screen substrate shown in FIG. 3A.

Figure 5A:
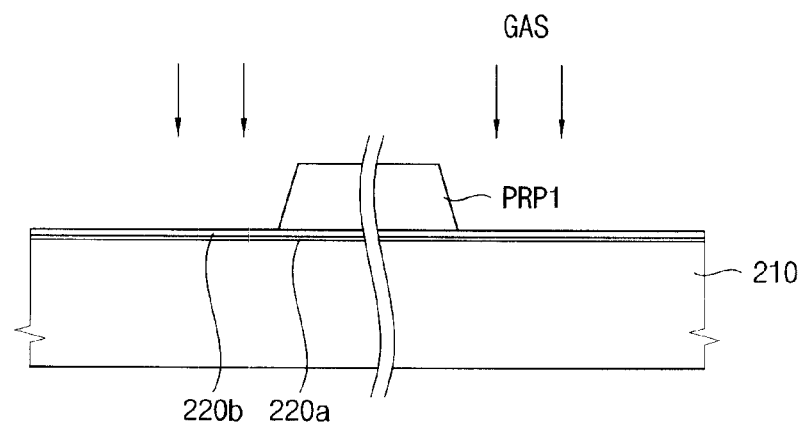
FIGS. 5A and 5B and FIGS. 6 to 11 are cross-sectional views illustrating a method of manufacturing the touch screen substrate shown in FIG. 3A.
Figure 5B:
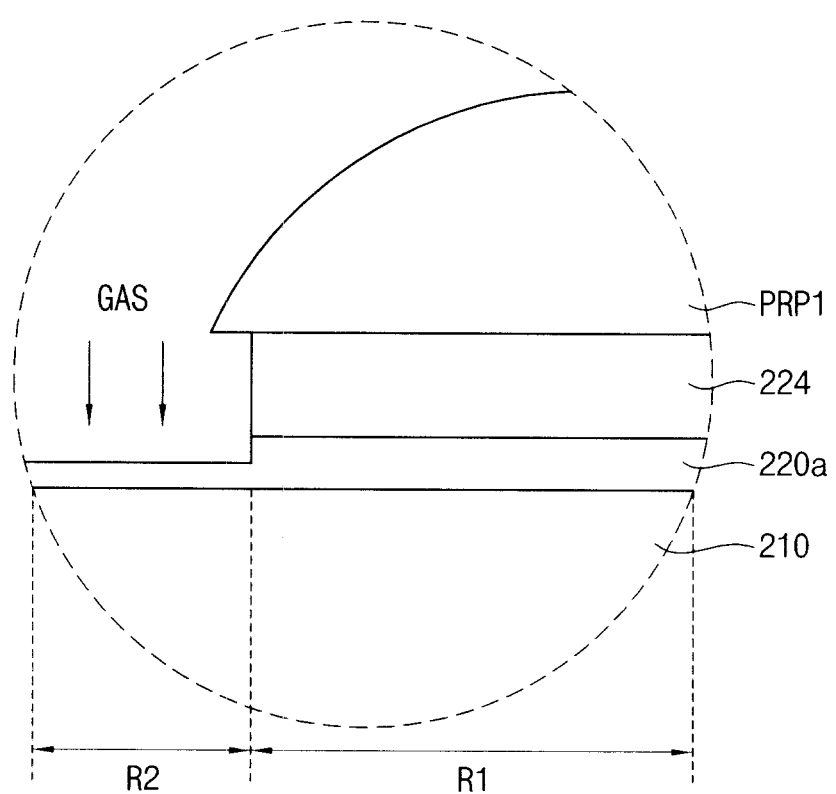

FIGS. 5A and 5B are cross-sectional views illustrating a process for forming the light blocking pattern BP shown in FIG. 3A.

Referring to FIG. 5A, a sacrificial layer 220a is formed on the second base substrate 210, and a parent light blocking layer 220b is formed on the second base substrate 210 having the sacrificial layer 220a. The sacrificial layer 220a may include silicon nitride ($SiN_x$, $0<x\le1$) or silicon oxide ($SiO_y$, $0<y\le1$), etc. The parent light blocking layer 220b may include amorphous silicon germanium (a-SiGe).

A first photoresist pattern PRP1 is formed on the second base substrate 210 having the parent light blocking layer 220b. For example, a positive photoresist composition is coated on the second base substrate 210 having the parent light blocking layer 220b to form a photoresist layer, and the photoresist layer is patterned by an exposure process and a development process to form the first photoresist pattern PRP1.

Then, the parent light blocking layer 220b is patterned using the first photoresist pattern PRP1 as an etching stopping layer. The parent light blocking layer 220b may be patterned by a dry etching process having anisotropic characteristics and using an etching gas.

Referring to FIG. 5B, the parent light blocking layer 220b is patterned using the first photoresist pattern PRP as the etching stopping mask and the etching gas, so that the parent light blocking layer 220b in a first region R1 in which the first photoresist pattern PRP1 is formed remains to form the light blocking layer 224. In addition, the parent light blocking layer 220b in a second region R2 in which the first photoresist pattern PRP1 is not formed is removed, so that the sacrificial layer 220a in the second region R2 is exposed.

As the parent light blocking layer 220b is excessively and gradually etched to prevent the parent light blocking layer 220b from partially remaining on the second base substrate 210, the sacrificial layer 220a is gradually removed. When the second base substrate 210 is exposed after the parent light blocking layer 220b in the second region R2 is removed, the etching gas etches even the patterned parent light blocking layer 220b because the etching gas has no more portions to etch on the second base substrate 210, thus leaving an undercut at a lower portion of the light blocking layer 224. After the parent light blocking layer 22b is patterned to form the light blocking layer 224, the sacrificial layer 220a formed under the light blocking layer 224 is dominantly etched by the etching gas compared to the light blocking layer 224 because of the anisotropic characteristic of the etching gas. After the sacrificial layer 220a in the second region R2 is completely removed, the sacrificial layer 220a in the first region R1 remains to form the inorganic layer 222. Thus, the light blocking pattern BP is formed on the second base substrate 210.

The sacrificial layer 220a is formed under the parent light blocking layer 220b while forming the light blocking pattern BP, so that the sacrificial layer 220a prevents the etching gas from penetrating the light blocking layer 224. Thus, the sacrificial layer 220a prevents an undercut from being formed at the lower portion of the light blocking layer 224. In addition, the sacrificial layer 220a enhances an adhesive strength between the parent light blocking layer 220b and second base substrate 210.

Figure 6:
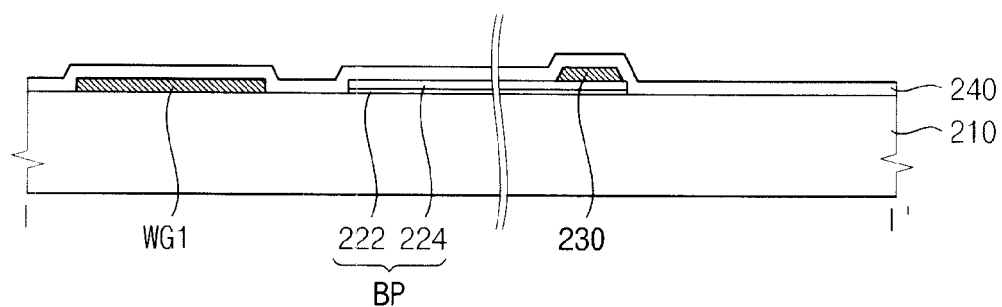

Referring to FIG. 6, the first metal pattern including the first switching gate electrode WG1 and the contact electrode 230 is formed on the second base substrate 210 including the blocking pattern BP. A first metal layer is formed on the second base substrate 210 having the light blocking pattern BP, and the first metal layer is patterned to form the first metal pattern. The contact electrode 230 is formed on the light blocking pattern BP. The first metal pattern may further include the first sensing gate line SGL1, the third sensing gate line SGL3, and the second switching gate electrode WG2.

Then, the first insulating layer 240 is formed on the second base substrate 210 having the light blocking pattern BP and the first metal pattern.

Figure 7:
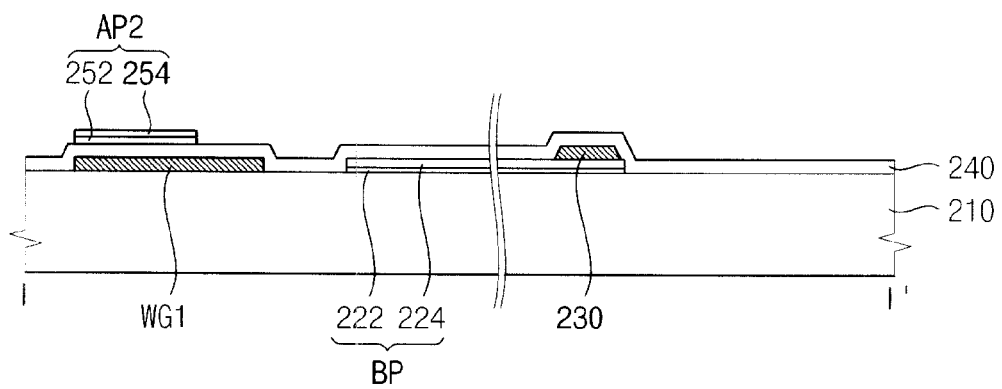

Referring to FIG. 7, the second active pattern AP2 is formed on the second base substrate 210 having the first insulating layer 240. The second semiconductor layer 252 and the second ohmic contact layer 254 are sequentially formed on the second base substrate 210 having the first insulating layer 240, and patterned to form the second active pattern AP2. The second active pattern AP2 is formed on the first switching gate electrode WG1. Although not shown in the figures, the third and fourth active patterns AP3 and AP4 of the second switching and sensing elements WTR2 and STR2 are formed by patterning the second semiconductor layer 252 and the second ohmic contact layer 254.

Figure 8:
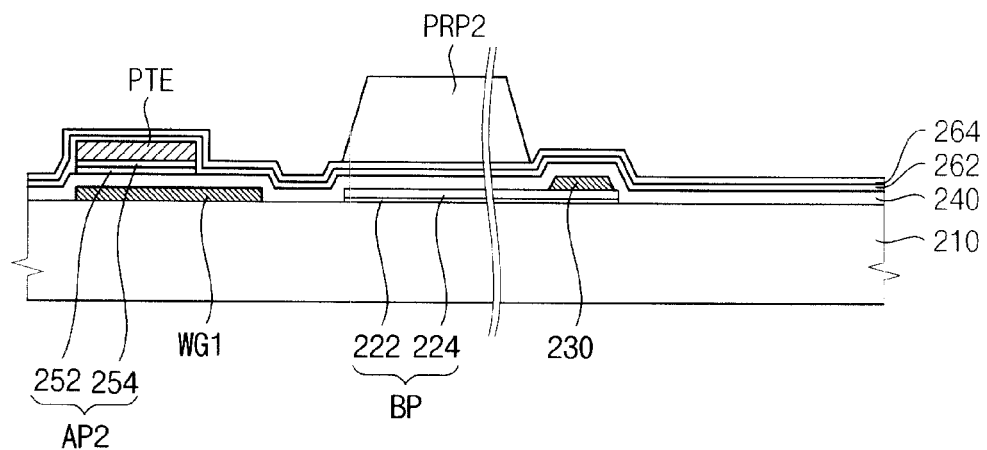

Referring to FIG. 8, a protective electrode PTE is formed on the second base substrate 210 having the second active pattern AP2. The protective electrode PTE is formed on the second active pattern AP2. The protective electrode PTE is formed by patterning a metal layer via a photolithography process.

The first semiconductor layer 262 and the first ohmic contact layer 264 are sequentially formed on the second base substrate 210 having the protective electrode PTE. The first semiconductor layer 262 includes amorphous silicon germanium (a-SiGe). The first ohmic contact layer 264 includes amorphous silicon doped with a high-concentration of n-type impurities (n+a-Si).

A second photoresist pattern PRP2 is formed on the second base substrate 210 having the first ohmic contact layer 264.

Figure 9:
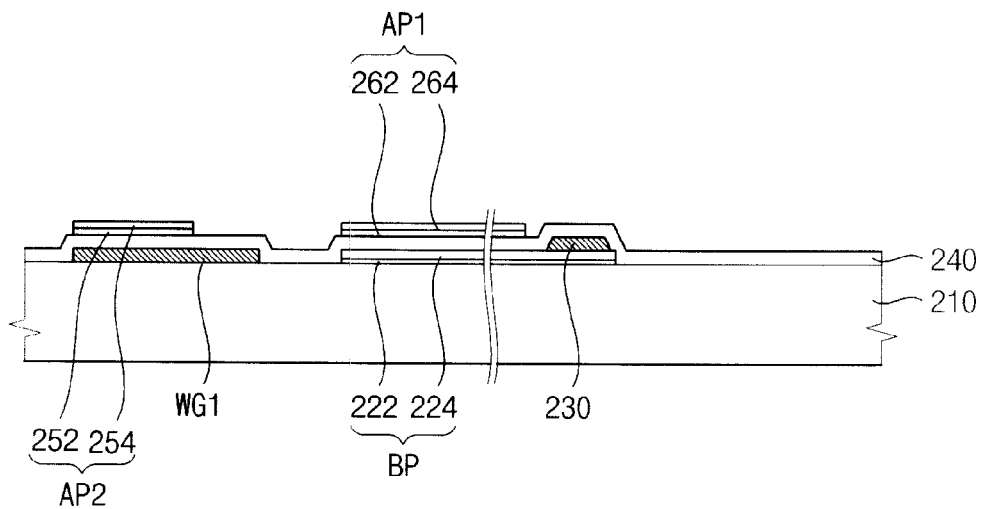

Referring to FIG. 9, the first semiconductor layer 262 and the first ohmic contact layer 264 are patterned using the second photoresist pattern PRP2 as an etching stopping layer. Thus, the first active pattern AP1 is formed on the light blocking pattern BP. The protective electrode PTE prevents the second active pattern AP2 from being damaged by an etching gas used to pattern the first semiconductor layer 262 and the first ohmic contact layer 264.

After removing the protective electrode PTE, the first active pattern AP1 and the second active pattern AP2 only remain on the first insulating layer 240.

Figure 10:
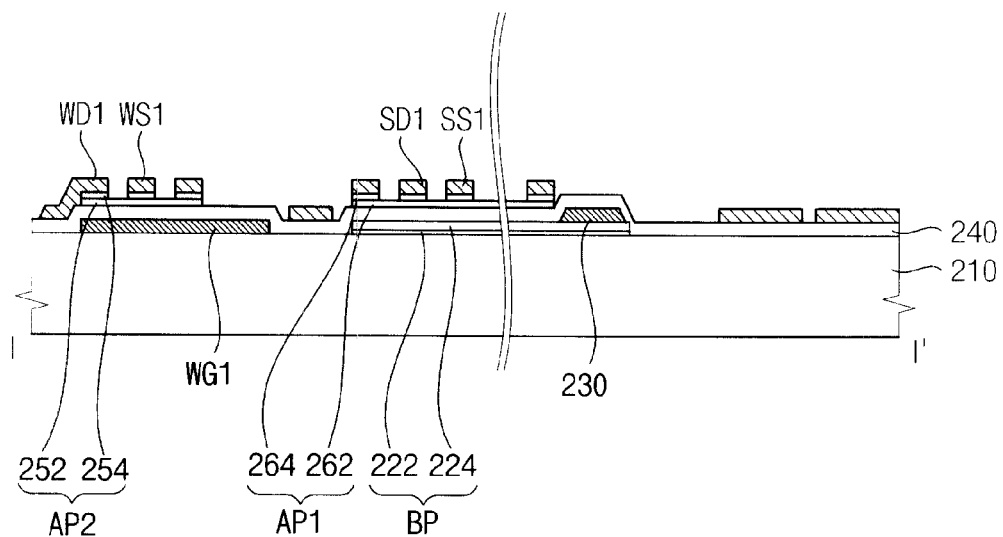

Referring to FIG. 10, the second metal pattern including the first switching source and drain electrodes WS1 and WD1 and the first sensing source and drain electrodes SS1 and SD1 is formed on the second base substrate 210 having the first and second active patterns AP1 and AP2. A second metal layer is formed on the second base substrate 210 having the first and second active patterns AP1 and AP2, and patterned to form the second metal pattern. The second metal pattern may further include the first and second read-out lines R/O1 and R/O2, the second switching source and drain electrodes WS2 and WD2, and the second sensing source and drain electrodes SS2 and SD2.

The second ohmic contact layer 254 exposed through a separated space between the first switching source and drain electrodes WS1 and WD1, and the first ohmic contact layer 264 exposed through a separated space between the first sensing source and drain electrodes SS1 and SD1 are removed using the second metal pattern as a mask to expose the first and second semiconductor layers 252 and 262 at the separated spaces.

Figure 11:
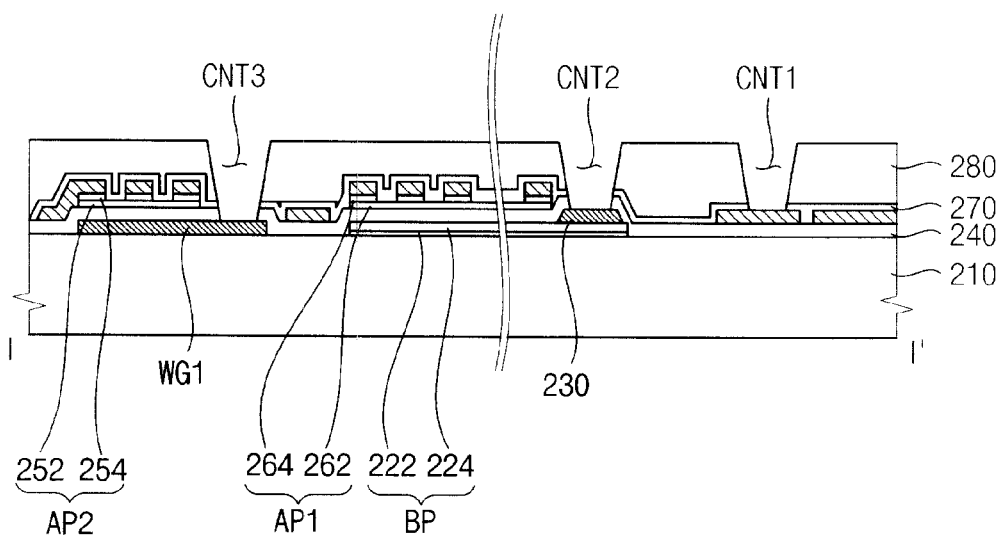

Referring to FIG. 11, the second and third insulating layers 270 and 280 are formed on the second base substrate 210 having the second metal pattern.

Then, the second and third insulating layers 270 and 280 formed over the first sensing source electrode SS1 are removed from a specified area to form the first contact hole CNT1 through the second and third insulating layers 270 and 280. In addition, the second and third insulating layers 270 and 280 on the contact electrode 230 are removed to form the second contact hole CNT2 through the second and third insulating layers 270 and 280. Simultaneously, the first, second, and third insulating layers 240, 270 and 280 formed over a portion of the first switching gate electrode WG1 are removed to form the third contact hole CTN3 through the first, second, and third insulating layers 240, 270 and 280.

Referring to FIGS. 11 and 3A, a third metal layer is formed on the second base substrate 210 having the first and second contact holes formed through the second and third insulating layers 270 and 280, and the third contact hole formed through the first, second and third insulating layers 240, 270 and 280. The third metal layer is patterned to form the third metal pattern. The third metal pattern includes the first and second top gate electrodes TG1 and TG2, the first and second sensing gate electrodes SG1 and SG2, the bias line VL, and the second sensing gate line SGL2.

The black matrix BM, the color filter CF, the over-coating layer OC, and the common electrode CE are formed on the second base substrate 210 having the third metal pattern. Thus, the first touch screen substrate 200 may be manufactured.

According to an exemplary embodiment, the undercut may be prevented from being formed at the lower portion of the light blocking layer 224 by forming the inorganic layer 222, although the parent light blocking layer 220b is excessively etched to prevent the parent light blocking layer 220b from remaining on the second base substrate 210. In addition, the inorganic layer 222 may enhance the adhesive strength between the light blocking layer 224 and the second base substrate 210.

Hereinafter, a touch screen substrate and a method of manufacturing the touch screen substrate according to an exemplary embodiment will be described referring to FIGS. 12A, 12B and FIGS. 13 to 15.

Figure 12A:
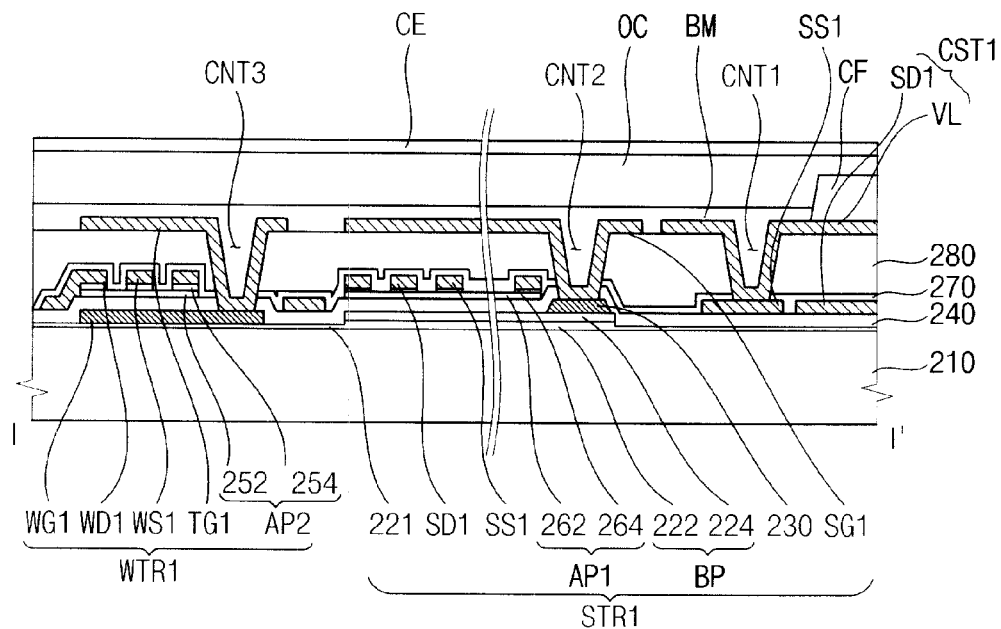
FIGS. 12A and 12B are cross-sectional views illustrating a touch screen substrate according to an exemplary embodiment of the present invention.
Figure 12B:
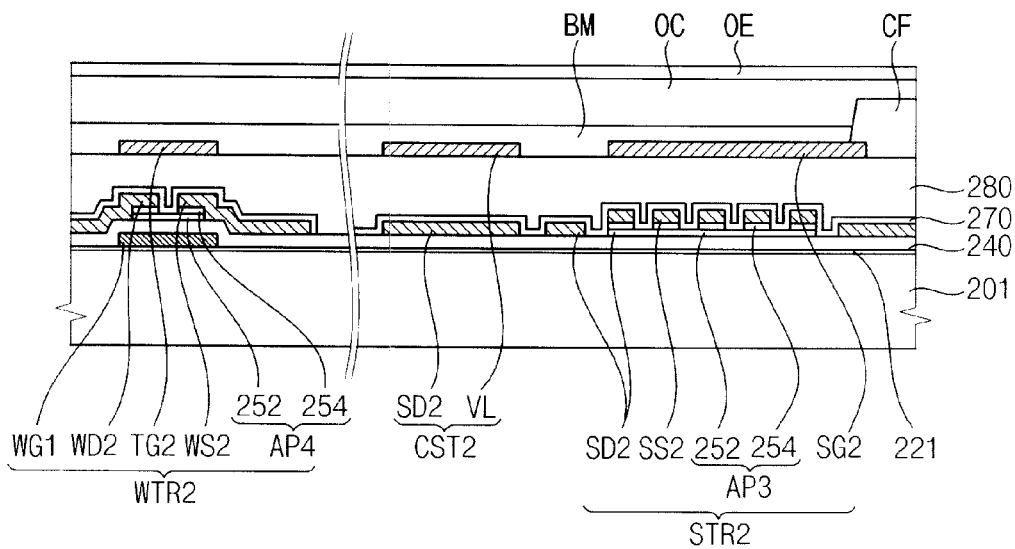

FIGS. 12A and 12B are cross-sectional views illustrating a touch screen substrate according to an exemplary embodiment of the present invention.

Referring to FIGS. 12A and 12B, a second touch screen substrate 202 includes a first switching element WTR1, a first sensing element STR1, a second switching element STR2, a first sensing gate line SGL1, a second sensing gate line SGL2, a third sensing gate line SGL3, a bias line VL, a first read-out line R/O1, a second read-out line R/O2, a light blocking pattern BP, a residual layer 221, a first capacitor Cst1, a second capacitor Cst2, a black matrix BM, a color filter CF, and a common electrode CE.

The second touch screen substrate 202 is substantially the same as the first touch screen substrate 200 shown in FIGS. 1, 2, 3A, 3B and 4 except for the residual layer 221. Thus, the repetitive description will be omitted.

The first sensing element STR1 is formed on the light blocking pattern BP.

The residual layer 221 is formed on an entire surface of the second base substrate 210 except for the light blocking pattern BP.

The second sensing element STR2, the first switching element WTR1, and the second switching element WTR2 are formed on the residual layer 221.

Figure 13:
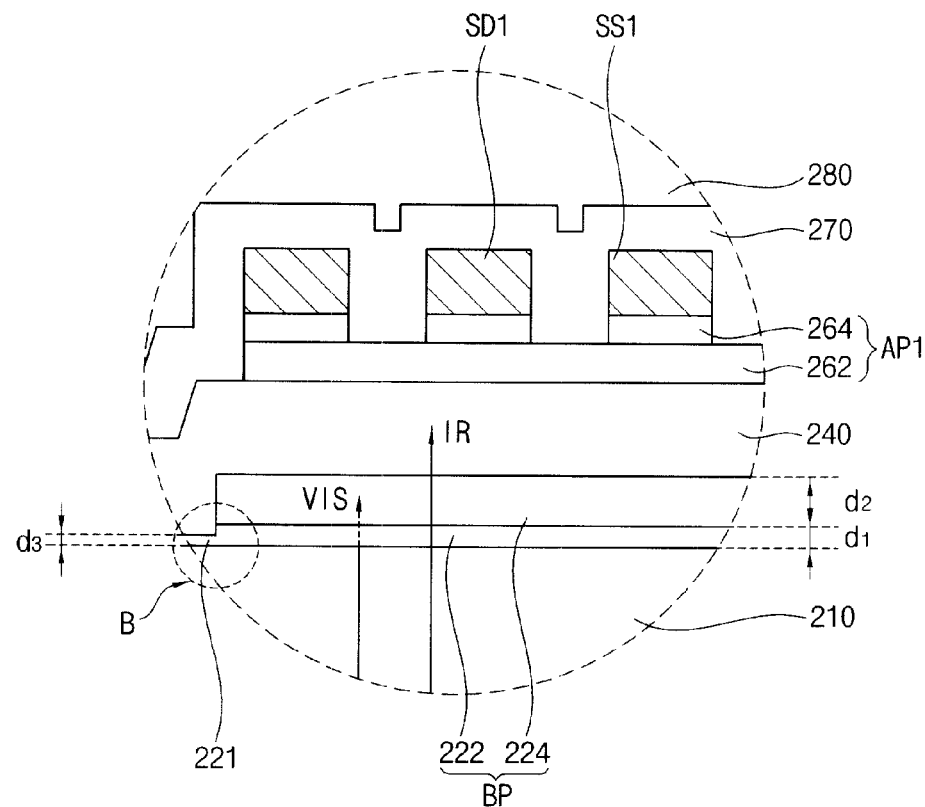
FIG. 13 is an enlarged cross-sectional view illustrating part of a first sensing element of FIG. 12A.

FIG. 13 is an enlarged cross-sectional view illustrating part of a first sensing element of FIG. 12A.

Referring to FIG. 13, the inorganic layer 222 has a first thickness $d_1$, and a light blocking layer 224 of the light blocking pattern BP has a second thickness $d_2$. The residual layer 221 has a third thickness $d_3$. The third thickness $d_3$ is smaller than the first thickness $d_1$. The residual layer 221 is formed of substantially the same material as the inorganic layer 222 of the light blocking pattern BP.

Etched surfaces "B" of the inorganic layer 222 and the light blocking layer 224 substantially coincides with each other. The residual layer 221 is formed on an entire surface of the second base substrate 210 adjacent to the inorganic layer 222, and the residual layer 221 surrounds the etched surfaces "B." The undercut may be prevented from being formed at a lower portion of the light blocking layer 224 by forming the inorganic layer 222. Thus, a lower side portion of the light blocking pattern BP may directly contact the second base substrate 210.

Figure 14:
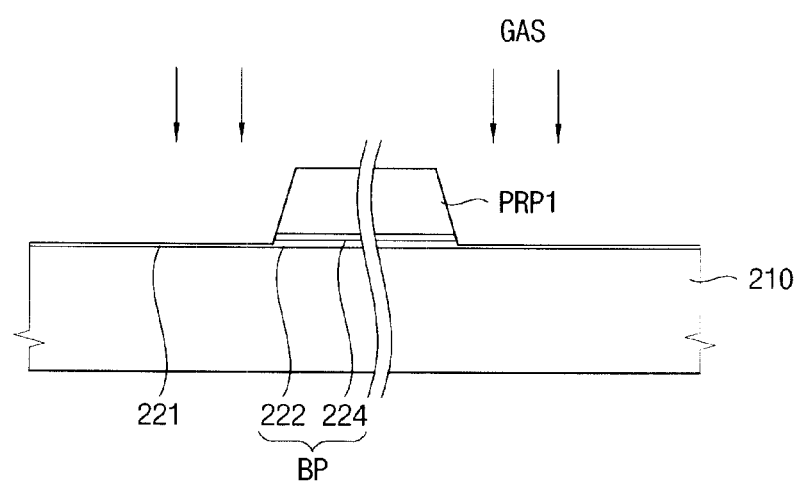
FIGS. 14 and 15 are cross-sectional views illustrating a method of manufacturing the touch screen substrate shown in FIG. 12A.
Figure 15:
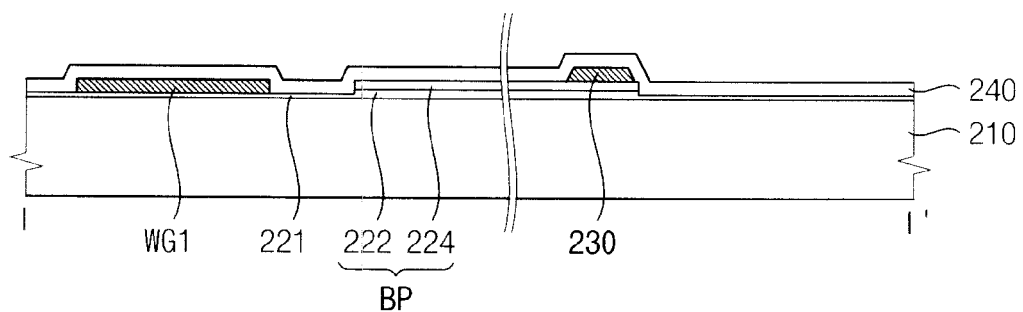

FIGS. 14 and 15 are cross-sectional views illustrating a method of manufacturing the touch screen substrate shown in FIG. 12A.

Referring to FIG. 14, the light blocking pattern BP including the inorganic layer 222 and the light blocking layer 224, and the residual layer 221 are formed on the second base substrate 210.

After a sacrificial layer 220a and a parent light blocking layer 220b are sequentially formed on the second base substrate 210, a first photoresist pattern PRP1 is formed on the parent light blocking layer 220b, as described referring to FIG. 5A. The sacrificial layer 220a and the parent light blocking layer 220b are patterned using the first photoresist pattern PRP1 as an etching stopping mask. The parent light blocking layer 220b is patterned to form the light blocking layer 224. The parent light blocking layer 220b is excessively etched while forming the light blocking layer 224, so that the sacrificial layer 220a is patterned to form the inorganic layer 222. The sacrificial layer 220a formed on a region except for a region on which the inorganic layer 222 is formed is not entirely removed but partially remains so that the residual layer 221 is formed.

Referring to FIG. 15, a first metal pattern including the first switching gate electrode WG1 and the contact electrode 230 is formed on the second base substrate 210 including the light blocking pattern BP and the residual layer 221. A process of forming the first metal pattern according to the present exemplary embodiment is substantially the same as that of forming the first metal pattern according to the exemplary embodiment described in connection with FIG. 6 except that the first metal pattern according to the present exemplary embodiment is formed on the residual layer 221. Thus, the repetitive description will be omitted.

Processes after the formation of the first metal pattern according to the present exemplary embodiment are substantially the same as those according to the exemplary embodiment described in connection with FIGS. 7 to 11. Thus, the repetitive description will be omitted.

Thus, the second touch screen substrate 202 shown in FIG. 12A may be manufactured.

According to an exemplary embodiment, the undercut may be prevented from being formed at the lower portion of the light blocking layer 224 by forming the inorganic layer 222 and the residual layer 221, even though the parent light blocking layer 220b is excessively etched to prevent the parent light blocking layer 220b from remaining on the second base substrate 210. In addition, the inorganic layer 222 may increase the adhesive strength between the light blocking layer 224 and the second base substrate 210.

Hereinafter, an effect of embodiments of the present invention will be described via experiments for evaluating the formed undercut and the adhesive strength.

Figure 16A:
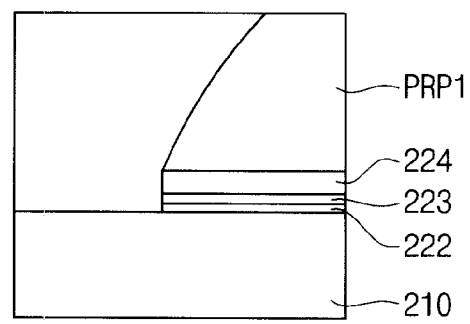
FIGS. 16A and 16B are cross-sectional views illustrating light blocking patterns manufactured by using example samples 1 and 2 according to the present invention.
Figure 16B:
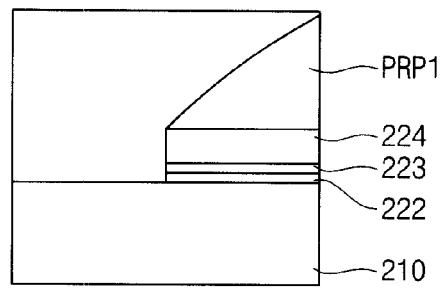
Figure 17A:
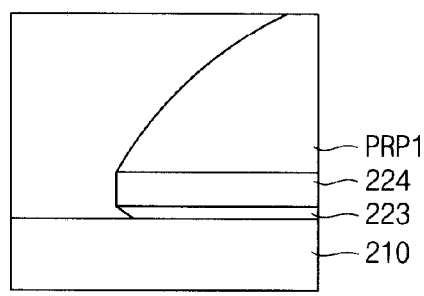
FIGS. 17A and 17B are cross-sectional views illustrating light blocking patterns manufactured by using comparative samples 1 and 2.
Figure 17B:
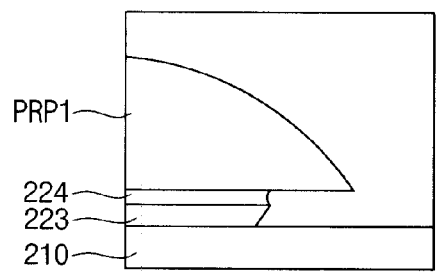

FIGS. 16A and 16B are cross-sectional views illustrating light blocking patterns manufactured by using Exemplary Samples 1 and 2 according an embodiment of the present invention. FIGS. 17A and 17B are cross-sectional views illustrating light blocking patterns manufactured by using Comparative Samples 1 and 2.

Manufacturing Exemplary Sample 1

A sacrificial layer including silicon nitride and having a thickness of about 500 Å, an amorphous germanium layer having a thickness of about 500 Å, and a parent light blocking layer including an amorphous silicon germanium and having a thickness of about 1,500 Å were sequentially formed on a second base substrate as a glass substrate, and then a first photoresist pattern was formed on the parent light blocking layer.

Manufacturing Comparative Sample 1

A parent light blocking layer including an amorphous germanium layer having a thickness of about 500 Å and an amorphous silicon germanium layer having a thickness of about 1,500 Å were sequentially formed on a second base substrate as a glass substrate, and then a first photoresist pattern was formed on the parent light blocking layer.

EXPERIMENT 1

Evaluation of Formed Undercut

Each of Exemplary Sample 1 and Comparative Sample 1 was excessively etched using the first photoresist pattern as an etching stopping layer and an etching gas. The etching gas included sulfur hexafluoride ($SF_6$) and chlorine ($Cl_2$) in a ratio of about 1:15. The etching was performed for about 40 seconds under the condition of about 80 mT (milli tesla) and about 1,000 Ws (watt seconds), so that each of Exemplary Sample 1 and Comparative Sample 1 was about 30% overetched. Experimental results are illustrated in FIGS. 16A and 17A.

Discussion on Experiment 1

Referring to FIG. 16A, the amorphous germanium layer, the parent light blocking layer, and the sacrificial layer of Exemplary Sample 1 are patterned to form a light blocking pattern including a lower layer 223, a light blocking layer 224, and an inorganic layer 222 under the first photoresist pattern PRP1. An etched surface of the light blocking layer 224 substantially coincides with a side portion of the first photoresist pattern PRP1. In addition, etched surfaces of the lower layer 223 and the inorganic layer 222 substantially coincide with the side portion of the first photoresist pattern PRP1.

Referring to FIG. 17A, the amorphous germanium layer and the parent light blocking layer of Comparative Sample 1 are patterned to form a light blocking pattern including a lower layer 223 and a light blocking layer 224 under the first photoresist pattern PRP1. An etched surface of the light blocking layer 224 substantially coincides with a side portion of the first photoresist pattern PRP1. However, the amorphous germanium layer is excessively etched so that the lower layer 223 is recessed from the outer edge of the parent light blocking layer 224. A lower portion of the lower layer 223 is excessively etched by the etching gas to form an undercut between the lower layer 223 and the second base substrate 210.

Manufacturing Exemplary Sample 2

A sacrificial layer including silicon nitride and having a thickness of about 500 Å, an amorphous germanium layer having a thickness of about 500 Å, and a parent light blocking layer including amorphous silicon germanium and having a thickness of about 1,500 Å were sequentially formed on a second base substrate as a glass substrate, and then a first photoresist pattern was formed on the parent light blocking layer.

Manufacturing Comparative Sample 2

A parent light blocking layer including an amorphous germanium layer having a thickness of about 500 Å and an amorphous silicon germanium layer having a thickness of about 1,500 Å were sequentially formed on a second base substrate as a glass substrate, and then a photoresist pattern was formed on the parent light blocking layer.

EXPERIMENT 2

Evaluation of Formed Undercut

Each of Exemplary Sample 2 and Comparative Sample 2 was excessively etched using the first photoresist pattern as an etching stopping layer and an etching gas. The etching gas includes sulfur hexafluoride ($SF_6$) and chlorine ($Cl_2$) in a ratio of about 8:8. The etching was performed for about 40 seconds under the condition of about 30 mT (milli tesla) and about 1,200 Ws (watt seconds), so that each of Exemplary Sample 1 and Comparative Sample 1 was about 60% overetched. Experimental results are illustrated in FIGS. 16B and 17B.

Discussion on Experiment 2

Referring to FIG. 16B, the amorphous germanium layer, the parent light blocking layer, and the sacrificial layer of Exemplary Sample 2 were etched to form a light blocking pattern including a lower layer 223, a light blocking layer 224, and an inorganic layer 222 under the first photoresist pattern PRP1. An etched surface of the light blocking layer 224 substantially coincides with a side portion of the first photoresist pattern PRP1. In addition, etched surfaces of the lower layer 223 and the inorganic layer 222 substantially coincide with the side portion of the first photoresist pattern PRP1.

Referring to FIG. 17B, the amorphous germanium layer and the parent light blocking layer of Comparative Sample 2 are patterned to form a light blocking pattern including a lower layer 223 and a light blocking layer 224 under the first photoresist pattern PRP1. However, the amorphous germanium layer is excessively etched, so that the lower layer 223 is recessed from the outer edge of the parent light blocking layer 224. A lower portion of the lower layer 223 is excessively etched by the etching gas to form an undercut between the lower layer 223 and the second base substrate 210. The length of the undercut is about 491.2 nm.

According to an embodiment of the present invention, the undercut is remarkably reduced compared with the comparative samples, although the amorphous germanium layer and the amorphous silicon germanium layer are excessively etched to prevent the amorphous germanium layer and the amorphous silicon germanium layer from partially remaining on the second base substrate 210.

Figure 18A:
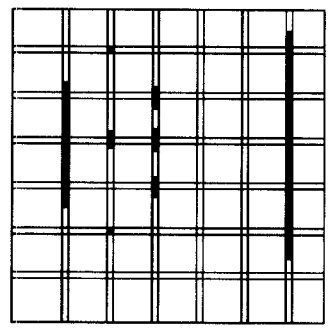
FIGS. 18A to 18C are conceptual views illustrating an adhesive strength for example samples 3, 4 and 5 according to the present invention.
Figure 18B:
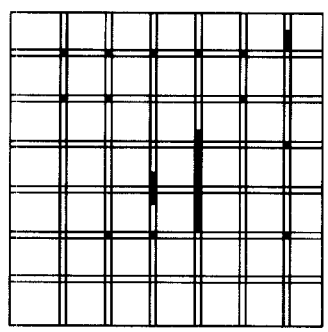
Figure 18C:
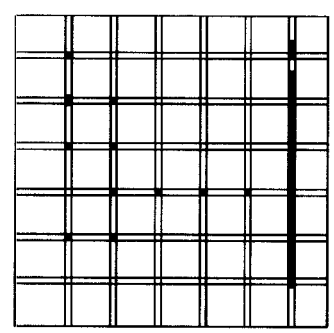
Figure 19A:
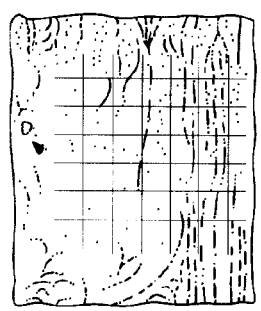
FIGS. 19A to 19C are conceptual views illustrating an adhesive strength for comparative samples 3, 4 and 5.
Figure 19B:
Figure 19C:
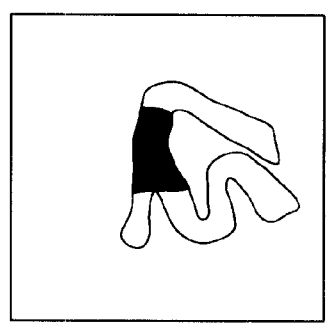

FIGS. 18A to 18C are conceptual views illustrating an adhesive strength for Exemplary Samples 3, 4, and 5 according to an embodiment of the present invention. FIGS. 19A to 19C are conceptual views illustrating an adhesive strength for Comparative Samples 3, 4, and 5.

Manufacturing Exemplary Sample 3

A silicon nitride layer having a thickness of about 500 Å and an amorphous silicon germanium layer having a thickness of about 2500 Å were formed on a glass substrate.

Manufacturing Exemplary Sample 4

A silicon nitride layer having a thickness of about 500 Å and an amorphous silicon germanium layer having a thickness of about 3,500 Å were formed on a glass substrate.

Manufacturing Exemplary Sample 5

A silicon nitride layer having a thickness of about 500 Å and an amorphous silicon layer having a thickness of about 4,500 Å were formed on a glass substrate.

Manufacturing Comparative Sample 3

An amorphous silicon germanium layer having a thickness of about 3,000 Å was formed on a glass substrate.

Manufacturing Comparative Sample 4

An amorphous silicon germanium layer having a thickness of about 4,000 Å was formed on a glass substrate.

Manufacturing Comparative Sample 5

An amorphous silicon germanium layer having a thickness of about 5,000 Å was formed on a glass substrate.

Evaluation for Adhesive Strength

A cross-cut tape test (ASTM D3359) was performed on each of Exemplary Samples 3 to 5 and Comparative Samples 3 to 5, with each of the samples cross-cut by a diamond wheel to have six cuts in each of horizontal and vertical directions, to measure an adhesive strength. Experimental results are illustrated in FIGS. 18A to 18C and 19A to 19C.

Referring to FIGS. 18A to 18C, the adhesive strength between the glass substrate and the silicon nitride layer of Exemplary Samples 3 to 5 was not less than "4 B."

Referring to FIGS. 19A and 19B, the adhesive strength between the glass substrate and the amorphous silicon germanium layer of Comparative Samples 3 and 4 was "0 B." Referring to FIG. 19C, the amorphous silicon germanium layer of Comparative Sample 5 was not attached to the glass substrate so that the Cross-Cut Tape Test could not be performed.

According to an embodiment of the present invention, the adhesive strength between the glass substrate and the amorphous silicon germanium layer may be increased by forming the inorganic layer.

According to an embodiment of the present invention, an undercut may be prevented from being formed at a lower portion of the light blocking pattern while forming the light blocking pattern which blocks visible light provided to the sensing element that senses infrared light. In addition, an adhesive strength between the light blocking pattern and the base substrate may be increased. Therefore, the reliability of a manufacturing process may be improved.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims.

What is claimed is:

1. A touch screen substrate comprising:
   a base substrate;
   a light blocking pattern including an inorganic layer formed on the base substrate and a light blocking layer formed on the inorganic layer, the light blocking layer transmitting infrared light and absorbing visible light, the inorganic layer being disposed between the light blocking layer and the base substrate and contacting the light blocking layer and the base substrate;
   a residual layer formed on a portion of the base substrate;
   a first sensing element formed on the light blocking pattern and sensing the infrared light; and
   a first switching element electrically connected to the first sensing element, wherein the first switching element is formed on the residual layer,
   wherein the inorganic layer comprises silicon nitride or silicon oxide,
   wherein the inorganic layer has a first thickness, wherein the residual layer has a second thickness, and wherein the second thickness is smaller than the first thickness.

2. The touch screen substrate of claim 1, wherein the inorganic layer has a thickness in a range of about 100 Å to about 1,000 Å, and the light blocking layer has a thickness in a range of about 1,500 Å to about 5,000 Å.

3. The touch screen substrate of claim 1, wherein the first sensing element comprises:
   a first active pattern formed on the light blocking pattern;
   a first sensing source electrode and a first sensing drain electrode formed on the first active pattern, wherein the first sensing source electrode and the first sensing drain electrode are spaced apart from each other; and
   a sensing gate electrode overlapping the first active pattern.

4. The touch screen substrate of claim 3, wherein the light blocking layer comprises amorphous silicon germanium (a-SiGe) or amorphous germanium (a-Ge).

5. The touch screen substrate of claim 1, further comprising:
   a bias line connected to the first sensing element;
   a first read-out line connected to the first switching element;
   a first sensing gate line connected to the first switching element to apply a first gate signal to the first switching element; and
   a second sensing gate line connected to the first sensing element to apply a second gate signal to the first sensing element.

6. The touch screen substrate of claim 5, further comprising:
   a second sensing element connected to the bias line and sensing the visible light;
   a second switching element connected to the second sensing element;
   a third sensing gate line connected to the second switching element to apply a third gate signal to the second switching element; and
   a second read-out line connected to the second switching element.

7. A touch screen substrate comprising:
a base substrate;
a light blocking pattern including an inorganic layer formed on the base substrate and a light blocking layer formed on the inorganic layer, the light blocking layer transmitting infrared light and absorbing visible light, the inorganic layer being disposed between the light blocking layer and the base substrate and contacting the light blocking layer and the base substrate;
a residual layer formed on a portion of the base substrate;
a first sensing element formed on the light blocking pattern and sensing the infrared light; and
a first switching element electrically connected to the first sensing element, wherein the first switching element is formed on the residual layer,
wherein the first sensing element comprises:
　a first active pattern formed on the light blocking pattern;
　a first sensing source electrode and a first sensing drain electrode formed on the first active pattern, wherein the first sensing source electrode and the first sensing drain electrode are spaced apart from each other; and
　a sensing gate electrode overlapping the first active pattern, wherein the sensing gate electrode contacts the light blocking pattern through a contact hole that partially exposes the light blocking pattern, the contact hole passing through a first insulating layer formed on the first active pattern and a second insulating layer formed on the first sensing source and drain electrodes.

8. A touch screen substrate comprising:
a base substrate;
a light blocking pattern including an inorganic layer formed on the base substrate and a light blocking layer formed on the inorganic layer, the light blocking layer transmitting infrared light and absorbing visible light, the inorganic layer being disposed between the light blocking layer and the base substrate and contacting the light blocking layer and the base substrate;
a residual layer formed on a portion of the base substrate;
a first sensing element formed on the light blocking pattern and sensing the infrared light; and
a first switching element electrically connected to the first sensing element, wherein the first switching element is formed on the residual layer,
wherein the first sensing element comprises:
　a first active pattern formed on the light blocking pattern;
　a first sensing source electrode and a first sensing drain electrode formed on the first active pattern, wherein the first sensing source electrode and the first sensing drain electrode are spaced apart from each other; and
　a sensing gate electrode overlapping the first active pattern,
wherein the first switching element comprises:
　a first switching source electrode electrically connected to the first sensing drain electrode;
　a first switching drain electrode spaced apart from the first switching source electrode,
　a second active pattern overlapping each of the first switching source and drain electrodes; and
　a first switching gate electrode overlapping the second active pattern.

9. A touch screen substrate comprising:
a base substrate;
a light blocking pattern including an inorganic layer formed on the base substrate and a light blocking layer formed on the inorganic layer, the light blocking layer transmitting infrared light and absorbing visible light;
a residual layer formed on an entire region of the base substrate except for a region on which the inorganic layer is formed, and having a thickness smaller than a thickness of the inorganic layer;
a first sensing element formed on the light blocking pattern and sensing the infrared light; and
a first switching element electrically connected to the first sensing element, wherein the first switching element is formed on the residual layer.

10. The touch screen substrate of claim 9, wherein the inorganic layer comprises silicon nitride or silicon oxide.

11. The touch screen substrate of claim 9, wherein the inorganic layer has a thickness in a range of about 100 Å to about 1,000 Å, and the light blocking layer has a thickness in a range of about 1,500 Å to about 5,000 Å.

12. The touch screen substrate of claim 9, wherein the first sensing element comprises:
　a first active pattern formed on the light blocking pattern;
　a first sensing source electrode and a first sensing drain electrode formed on the first active pattern, wherein the first sensing source electrode and the first sensing drain electrode are spaced apart from each other; and
　a sensing gate electrode overlapping the first active pattern.

13. The touch screen substrate of claim 12, wherein the light blocking layer comprises amorphous silicon germanium (a-SiGe) or amorphous germanium (a-Ge).

14. The touch screen substrate of claim 12, wherein the first sensing gate electrode contacts the light blocking pattern through a contact hole that partially exposes the light blocking pattern, the contact hole passing through a first insulating layer formed on the first active pattern and a second insulating layer formed on the first sensing source and drain electrodes.

15. The touch screen substrate of claim 12, wherein the first switching element comprises:
　a first switching source electrode electrically connected to the first sensing drain electrode;
　a first switching drain electrode spaced apart from the first switching source electrode,
　a second active pattern overlapping each of the first switching source and drain electrodes; and
　a first switching gate electrode overlapping the second active pattern.

16. The touch screen substrate of claim 9, further comprising:
　a bias line connected to the first sensing element;
　a first read-out line connected to the first switching element;
　a first sensing gate line connected to the first switching element to apply a first gate signal to the first switching element; and
　a second sensing gate line connected to the first sensing element to apply a second gate signal to the first sensing element.

17. The touch screen substrate of claim 16, further comprising:
　a second sensing element connected to the bias line and sensing the visible light;
　a second switching element connected to the second sensing element;
　a third sensing gate line connected to the second switching element to apply a third gate signal to the second switching element; and a second read-out line connected to the second switching element.

\* \* \* \* \*